United States Patent [19]

Ohba et al.

[11] Patent Number: 4,816,705
[45] Date of Patent: Mar. 28, 1989

[54] BI-CMOS LOGIC CIRCUIT

[75] Inventors: Osam Ohba, Inagi; Tetsu Tanizawa, Kawasaki, both of Japan

[73] Assignee: Fujitsu Limited, Kawasaki, Japan

[21] Appl. No.: 53,568

[22] Filed: May 21, 1987

Related U.S. Application Data

[63] Continuation of Ser. No. 627,575, Jul. 3, 1984, abandoned.

[30] Foreign Application Priority Data

Jul. 8, 1983 [JP] Japan ............................... 58-123499
Jul. 8, 1983 [JP] Japan ............................... 58-123500

[51] Int. Cl.$^4$ .................. H03K 19/02; H03K 19/094; H03K 17/60
[52] U.S. Cl. .................. 307/446; 307/450; 307/570; 307/574; 307/581
[58] Field of Search .................. 307/574–576, 307/446, 451, 570, 579, 581, 585, 450, 475

[56] References Cited

U.S. PATENT DOCUMENTS

| | | | |
|---|---|---|---|
| 3,649,851 | 3/1972 | Cohen | 307/270 |
| 3,879,619 | 4/1975 | Pleshko | 307/255 |
| 4,021,684 | 5/1977 | Macey | 307/268 |
| 4,103,188 | 7/1978 | Morton | 307/255 |
| 4,129,879 | 12/1978 | Tantraporn et al. | 357/23.4 |
| 4,209,713 | 6/1980 | Satov et al. | 307/451 |
| 4,365,316 | 12/1982 | Iwahashi et al. | 307/297 |
| 4,532,439 | 7/1985 | Koike | 307/451 |

FOREIGN PATENT DOCUMENTS

| | | | |
|---|---|---|---|
| 83106796 | 1/1984 | European Pat. Off. | |
| 3013471 | 10/1980 | Fed. Rep. of Germany | |
| 145004A | 12/1983 | Japan | 307/446 |
| 0099100 | 1/1984 | Japan | 307/570 |
| 2080651 | 2/1982 | United Kingdom | |

OTHER PUBLICATIONS

Patent Abstract of Japan, vol. 4, No. 8 (E166), Jan. 22, 1980, p. 103 E 166; and JP-A-54 148469 (Oki Denki Kogyo K.K.) 20-11-1979.
Patent Abstract of Japan, vol 5, No. 3 (E-40)[675], Jan. 10, 1981 and JP-A-55 134960, (Daini Seikosha K.K.) 21-10-1980.

*Primary Examiner*—John S. Heyman
*Assistant Examiner*—M. R. Wambach
*Attorney, Agent, or Firm*—Armstrong, Nikaido, Marmelstein & Kubovcik

[57] ABSTRACT

A complementary logic circuit which has large power handling capacity, high switching speed and still has low power consumption is disclosed. The circuit is composed of a first stage comprising a complementary MIS-FET, and an output stage comprising complementary bipolar transistors or complementary vertical FETs. The output stage is provided with pull-up and pull-down elements, which pull up or pull down the amplitude of the output signal almost equal to that of the power supply voltages. Accordingly, the lack of sufficient amplitude in the conventional Bi-MIS circuit to drive the C-MIS circuit is improved, and it secures the stable operation of C-MIS logic circuits.

7 Claims, 5 Drawing Sheets

FIG. 4(4.1)
FIG. 4(4.2)
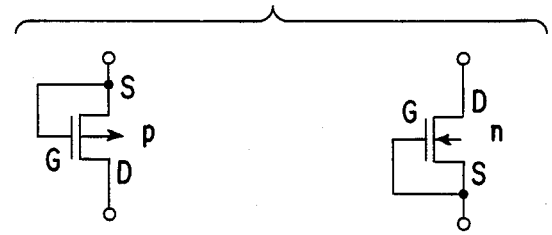
FIG. 4(4.3)
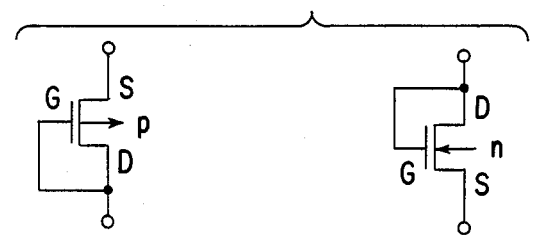

BI-CMOS LOGIC CIRCUIT

This application is a continuation of application Ser. No. 627,575, filed July 3, 1984, abandoned.

BACKGROUND OF THE INVENTION

The present invention relates to a complementary logic circuit, more precisely, to a complementary IC (Integrated Circuit) which enables a high speed switching of signals at high current level without increasing power consumption. The circuit of the present invention is provided with pull-up or pull-down elements which pull up or pull down the level of the output signal to a value close to that of the power supply voltage. The circuit is realized by combining MIS (Metal Insulator Semiconductor) transistors and bipolar transistors or vertical FETs (Field Effect Transistors).

A complementary MIS (C-MIS) type logic circuit is widely used as a very low power consumption circuit, but it has disadvantages of a rather low switching speed and a rather low power handling capacity. Therefore, it was difficult to drive large scale and complicated logic circuits with C-MIS.

There were attempts to overcome such defects of the complementary MIS circuit by combining MIS-FETs with bipolar transistors, especially a vertical type bipolar transistor, which has high speed and high power handling capacity. Such circuits are sometimes called Bi-MIS circuits and are used widely (for example, U.S. patent application No. 373,845 which is laid open in Japan with Provisional Publication No. 38454/'75, by C. H. Grady). But there appeared other difficulties with such improved circuits, as will be described later, and the improvement was inadequate. The problem was imposed mainly by the lack of signal amplitude sufficient to operate a large and complicated C-MIS circuit. The insufficient signal level caused a slightly-ON state in the C-MIS logic circuit which is driven by the Bi-MIS circuit. Another problem was a rush current which runs through the bipolar transistors at the transient of switching. These increased the quiescent current and temperature of the IC chip, and the increased temperature imposed undesirable effects on the reliability of the devices.

SUMMARY OF THE INVENTION

The object of the present invention is, therefore, to improve the complementary logic circuit and provide a circuit which has high switching speed and high power handling capacity, and still operates with low power consumption.

Another object of the present invention is to provide a complementary logic circuit which provides a large amplitude signal, which is sufficient to drive a C-MIS circuit.

The foregoing object is attained by combining C-MIS with bipolar transistor or vertical FETs, and further providing them with elements which pull down or pull up the level of the output signals to a level close to the source voltage.

For an inverting type logic (FIG. 2a), the circuit of the present invention comprises a first (input) stage circuit which is composed of a pair of p-channel and n-channel MIS transistors, and a second (output) stage circuit which is composed of a pair of pnp type and npn type bipolar transistors. For a non-inverting type logic (FIG. 2b), the logic circuit of the present invention comprises a first (input) stage circuit which is composed of a pair of an n-channel and a p-channel MIS transistor, and a second (output) stage circuit which is composed of a pair of a pnp type and an npn type bipolar transistor. Each pair of the MIS transistors and the bipolar transistors forms respectively a complementary circuit.

Each bipolar transistor is provided with a pull-up or pull-down element which is connected between the base electrode and the voltage source. These elements substantially pull down or pull up the output voltage of the circuit to a value close to the source voltage, and the above mentioned defects of the complementary MIS logic circuit are eliminated. The bipolar transistors may be replaced by vertical FETs (V-FETs), and this replacement further enhances the above mentioned improvements.

The effects and features of the invention will become clear from the description referring to the following detailed description of the invention, together with the accompanying drawings.

BRIEF DESCRIPTION OF THE DRAWINGS

FIG. 2 shows circuit diagrams of improved complementary logic circuits of the present invention which are provided with pull-up and pull-down elements, wherein:

FIG. 3 shows circuit diagrams of improved complementary logic circuits corresponding to those of FIG. 2, in which the bipolar transistors are replaced by vertical FETs, wherein:

FIG. 4 shows circuit diagrams of circuitry which are applicable for the pull-up and pull-down elements of the present invention, wherein:

FIG. 4.1 shows circuitry using a resistor;

FIG. 4.2 shows circuitry using a depletion type

FIG. 4.3 shows circuitry using MIS-FET; and

FIG. 5 shows another embodiment of the present invention illustrating another connection of the circuit which enhances the pull-up and pull-down action, wherein:

Figure 1B:
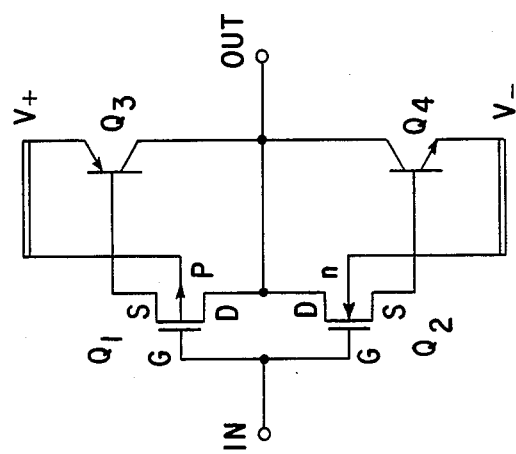
FIG. 1b shows a Bi-MIS logic circuit which is a non-inverting type circuit.

In each drawing, figures having a suffix "a" indicate inverting type logic circuits, and figures having a suffix "b" indicate non-inverting type logic circuits. Similar notations or reference numerals designate similar or corresponding part throughout the drawings.

DETAILED DESCRIPTION OF THE INVENTION

As mentioned before, though the complementary FET (C-FET) logic circuit has merits of low power consumption and easy to fabricate, it also has defects.

Figure 1A:
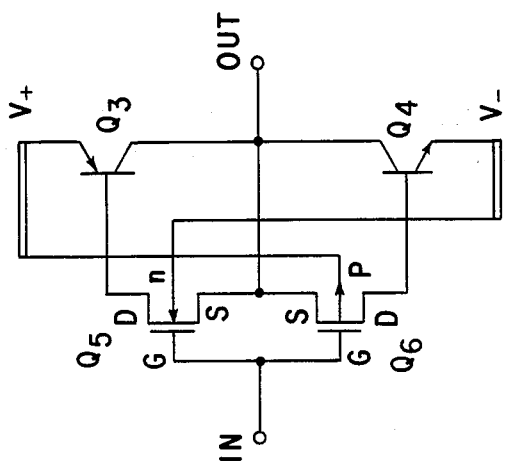
FIG. 1a shows a prior art Bi-MIS logic circuit, which is an inverting type circuit.

FIG. 1 shows examples of Bi-MIS (combined Bipolar and MIS) complementary logic circuits. FIG. 1a shows an inverting type, and FIG. 1a shows a non-inverting logic circuit. The first stage of the inverting type circuit of FIG. 1a is an inverter circuit composed of complementary MIS transistors $Q_1$ (p-channel) and $Q_2$ (n-channel). The second stage (output stage) is a buffer amplifier composed of complementary bipolar transistors Q₃ (pnp) and Q₄ (npn). The gate electrodes of MIS transistors Q₁ and Q₂ are connected with each other and receive the input signal IN. The source electrodes of MIS transistors Q₁ and Q₂ are respectively connected to the base electrodes of bipolar transistors Q₃ and Q₄. The drain electrodes of the MIS transistors Q₁ and Q₂, and the collector electrodes of the bipolar transistors Q₃ and Q₄ are connected with each other and provide the output signal OUT. The emitter electrodes of the bipolar transistor Q₃ and Q₄ are respectively connected to the positive side and negative side voltage sources $V_+$ and $V_-$.

The operation of the circuit is as follows. When the input signal IN becomes H (high level), the n-channel MIS transistor Q₂ in turned ON (conductive) and the base electrode of the bipolar transistor Q₄ is pulled up to a high level, because the current is supplied from the output side, namely, before the switching action beings, IN was low level and OUT was high, so the stray capacitance of the output circuit supplies the current to charge up the base of the transistor Q₄ through the transistor Q₂, therefore the transistor Q₄ also becomes ON, and the output signal becomes L (low level).

On the contrary, when the input signal IN becomes L, the p-channel MIS transistor Q₁ is turned ON, and the base electrode of the pnp transistor Q₃ is pulled down, so the transistor Q₃ becomes ON and the output signal OUT becomes H (high level). Ultimately, the MIS transistor Q₂ and the npn transistor Q₄ are both in a cut off state. Therefore, the all over circuit is an inverting type.

As described above, when the input signal IN is H, the transistors Q₁ and Q₃ are cut off, and when the input signal is L, the transistors Q₂ and Q₄ are cut off, therefore, when the switching action is over and in a stable state, the dark current which runs from the positive voltage source $V_+$ to negative voltage source $V_-$ through the circuit is almost zero, so the power consumption of the circuit is very small.

The non-inverting type circuit can be realized by serially connecting the inverting type circuit. But it can also be realized as shown in FIG. 1b. The first stage circuit of FIG. 1b is composed of non-inverting complementary MIS transistors Q₅ (n-channel) and Q₆ (p-channel). The second stage is similar to that of FIG. 1a.

The gate electrodes of MIS transistors Q₅ and Q₆ are connected with each other and receive the input signal IN. The drain electrodes of MIS transistors Q₅ and Q₆ are respectively connected to the base electrodes of bipolar transistors Q₃ and Q₄. The source electrodes of the MIS transistors Q₅ and Q₆, and the collector electrodes of the transistors Q₃ and Q₄ are connected with each other and provide the output signal OUT. The emitter electrodes of the bipolar transistor Q₃ and Q₄ are respectively connected to the positive and negative voltage sources $V_+$ and $V_-$.

In FIGS. 1a and 1b, the channel regions of the p-channel FETs Q₁ and Q₆ are supplied with positive voltage, and the channel regions of the n-channel FETs Q₂ and Q₅ are supplied with negative voltage. This is a common way to use the MIS-FETs.

The operation of the non-inverting circuit can be easily understood from the analogy of the foregoing description by one skilled in the art, so it is omitted from the disclosure for the sake of simplicity. In the cases of FIG. 1, the output circuit is composed by bipolar transistors, whose ON-resistance is much smaller than that of a MIS-FET, so it is possible to switch a high current signal, and drive a large complicated logic circuit which has inevitably a large stray capacitance. The time constant of the circuit to switch from L to H or vice versa is determined by the stray capacitance and the ON-resistance of the driver transistors.

But such improvement is still inadequate, because generally in a C-MIS circuit it is necessary to drive the C-MIS circuit with a sufficiently high level or low level signal, because if not, one of the p or n-channel FETs in the C-MIS circuit assumes a slightly-ON state, and the current from the positive voltage source to negative voltage source through the C-MIS circuit is not perfectly pinched off and the dark current increases. When the circuit integration becomes high, and many C-MIS gates are driven by such a circuit, the chance of causing such dark current increases, and the temperature rise of the IC chip imposes an undesirable effect on reliability.

Moreover, for a high speed C-MOS gate, each of the MOS transistors is designed with its threshold voltage $V_{th}$ ($\simeq |V_{GS}|$) set to a very low value, for example $0.5 \sim 0.8$ volt, in order to get a low ON-resistance to attain high switching speed. It is, therefore, desirable to drive such a C-MOS circuit with an H or L signal which is higher than the positive side source voltage minus 0.5 volts or lower than the negative side source voltage plus 0.5 volts, respectively.

In the circuits like FIGS. 1a and 1b. the output signal level is approximately $V_+ - V_{BE}$ for high level and $V_- + V_{BE}$, for low level, where $V_{BE}$ is a base-emitter forward voltage of the bipolar transistor Q₃ or Q₄. For ordinary bipolar transistors $V_{BE}$ is approximately 0.8 volts. This is a contradiction to the above mentioned requirements for the input signal for C-MOS circuits. So when the circuits like FIGS. 1a and 1b were used for driving a large scale complicated logic circuit, they often suffered from a lack of driving voltage, and caused an increase of dark current and power consumption.

There exist another problem, that is the increase of the rush current of the Bi-MIS circuit. The foregoing explanation of Bi-MIS logic was made with respect to the stable state. But the problem occurs at the transition between L to H or vice versa. At the beginning of the transition, consider that the IN varies from L to H, the p-channel MIS transistor Q₁ and the pnp bipolar transistor Q₃ are still ON, and in this instant the rush current from $V_+$ to $V_-$ through the transistors Q₃ and Q₄ becomes very large. This is serious for Bi-MIS circuits, because such rush current is amplified by bipolar transistors.

The present invention provides two methods to improve the above mentioned problems. The first method is providing pull-up and pull-down elements to substantially reduce the $V_{BE}$, and to increase the amplitude of the output signal almost equal to the source voltage. Moreover, since the bipolar transistor is perfectly cut off, the rush current is reduced to a greater extent. The second method is replacing the bipolar transistors with vertical FETs (V-FETs), which have very low ON-resistance which corresponds to $V_{th}$. These two methods ca be applied at the same time, and the construction and the effect of the present invention will be disclosed hereinafter.

Figure 2B:
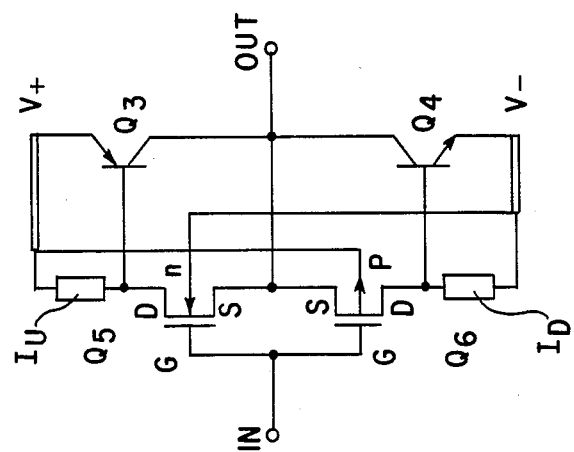
FIG. 2b shows a non-inverting type circuit.
Figure 2A:
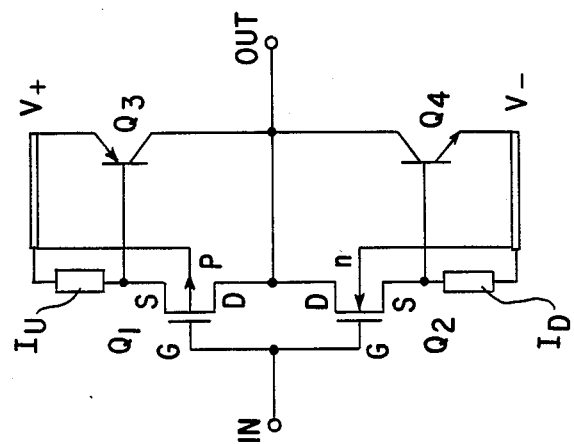
FIG. 2a shows an inverting type circuit.

FIG. 2 shows circuit diagrams of improved complementary logic circuits of the present invention. FIGS. 2a shows an inverting type circuit, and FIG. 2b shows a non-inverting type circuit. Comparing the figures with those of FIG. 1, it will be noticed that, the improved circuits have an additional pull-up element $I_U$ which is connected between the base of pnp bipolar transistor $Q_3$ and the positive side of voltage source $V_+$, and an additional pull-down element $I_D$ which is connected between the base of the npn bipolar transistor $Q_4$ and the negative side of voltage source $V_-$. These pull-up and pull-down elements may be a resistor or some other circuitry, which will be described later with respect to FIG. 4.

The operation and effect of the pull-up and pull-down elements will be described with respect to an inverting type circuit of FIG. 2a. Let the pull-up and pull-down elements $I_U$ and $I_D$ be a resistor R. When the input signal IN begins to switch from L to H, the output signal OUT begins to drop in like manner as described with respect to FIG. 1a. If the resistor R is not inserted, the output voltage will drop to $V_{31} + V_{BE}$ and then the voltage drop will stop, because if the voltage goes down further the transistor $Q_4$ does not conduct the current, though the transistor $Q_4$ is in an active state. But if the source S of the n-channel MIS transistor $Q_2$ is connected to $V_-$ through a resistor R as shown in FIG. 2a (in the figure it is indicated by $I_D$), the output voltage can go down further. In this case the transistor $Q_4$ in the figure can be neglected, because there is no current in $Q_4$, so the output voltage is determined by a series connected circuit of $Q_2$ and R. In this series circuit of $Q_2$ and R the current is almost zero,(because the transistors $Q_1$ and $Q_3$ are in the cut off state). Therefore, the output voltage goes down to almost equal $V_-$.

In the case when the input signal turns from H to L, the transistors $Q_1$ and $Q_3$ are turned ON and the transistors $Q_2$ and $Q_4$ are turned OFF. Then, if the pull-up element $I_U$ is not connected, the output voltage will stop to rise at the voltage $V_+ - V_{BE}$, because if the voltage goes up further the transistor $Q_3$ cannot conduct the current, though it is in an active state. But if the resistor R is connected between the source of transistor $Q_1$ and $V_+$, the output voltage is determined by the current running through the series circuit of R and $Q_1$. Since this current is almost zero, the output voltage goes up to almost equal that of $V_+$.

The resistor R (the pull-up or pull-down element $I_U$ or $I_D$) has still other important effect. The explanation will be given with respect to the pull-down circuit. If the resistor R is not connected, that means the resistance is infinite, so that when a noise or surge voltage is induced in the output circuit, the output transistor $Q_4$ begins to conduct a current, since it is in an active state. Of course there is no problem to begin the transistor $Q_4$ conducting the current, but trouble occurs when at the same time the input signal varies its state from H to L and the transistor $Q_3$ begins to turn to the ON state, then both transistors $Q_3$ and $Q_4$ become active at the same time, and the current from the positive side to negative side of the voltage source through the transistors $Q_3$ and $Q_4$ becomes very large, and the rush current increases. It will be understood that similar trouble occurs when the input signal varies from L to H, if the pull-up element is not provided.

The chance of such trouble occurring increases as the scale of integration becomes large. Therefore, the stabilization effect of the pull-up and pull-down elements are becoming very important for large scale integrated circuits.

The second method to improve the Bi-MIS (combined circuit of Bipolar and MIS transistors) complementary logic circuit is done by replacing the bipolar transistors with vertical FETs (V-FETs).

The vertical FET is a field effect transistor whose channel is provided vertically oriented to the surface of the transistor (an ordinary FET has a channel parallel to the surface of the device). Vertical FETs are known from the early stage of FET technology (for example, by J. Nishizawa et al, "Field Effect Transistor vs. Analog Transistor" IEEE Transaction on Electron Devices ED-22, No. 4, Apr. 1975 or by J. Nishizawa "Static Induction Transistor Logic" Jap. Journal of Applied Physics, Vol. 17, 1978 Supplement 17-1). But the V-FET was not used so widely, because of complexity in fabrication compared to ordinary bipolar transistors. But the inventors noticed that when the vertical FET is used for the buffer stage of the complementary MIS (C-MIS) circuit, it has many advantages which overcome the defects of the C-MIS circuits.

The power handling capacity of the vertical FET is large (because the carrier runs through the vertical channel), and the source-drain voltage in the ON state which corresponds to $V_{BE}$ of bipolar transistor is very low. Therefore, the defects of the Bi-MIS circuit are improved, moreover, the pull-up and pull-down elements can be applied similarly as with bipolar transistors.

Figure 3B:
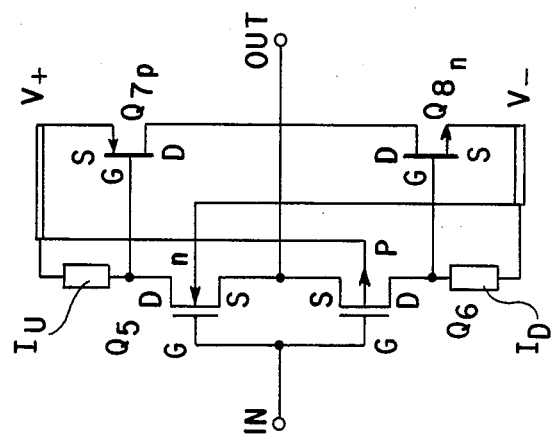
FIG. 3b shows a non-inverting type circuit.
Figure 3A:
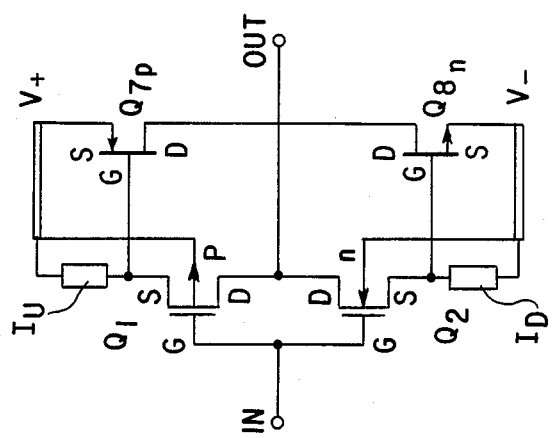
FIG. 3a shows an inverting type circuit.

FIG. 3 shows the circuit diagrams of the complementary logic circuit of the present invention. FIG. 3a is a circuit type circuit. Each corresponds to FIG. 2a and FIG. 2b respectively. As can be seen in the figures, the output stage transistors $Q_3$ and $Q_4$ re replaced respectively by p-channel vertical FETs $Q_7$ and n-channel vertical FET $Q_8$. The operation is quite similar to the circuits of FIG. 2. Namely, the first stage is inverting (FIG. 3a) or non-inverting (FIG. 3b) type C-MIS respectively. And the second stage (output stage) is non-inverting complementary vertical FETs.

The vertical FETs $Q_7$ and $Q_8$ are connected in series between the positive and negative voltage source $V_+$ and $V_-$. In any case of the IN signal (L or H), one of the vertical FET is in an OFF state. So, the current flowing directly from positive source to negative source is always pinched off, therefore, the rush current or power consumption of the circuit becomes very small. The pull-up and pull-down elements can be applied, and the operation and effects are similar to that of FIG. 2.

In the foregoing explanation the pull-up and pull-down elements were assumed to be a resistor R, but may be varied to some other circuitry. FIG. 4 tabulates some circuitries which can be used as the pull-up or pull-down elements. All the circuitries in the figure can be used as the pull-up or pull-down element.

FIG. 4.1 shows the circuitry with resistor R which was described before. The pull-up resistor R is connected between the positive side terminal $V_+$ of the voltage source and the base electrode of the pnp transistor $Q_3$ (or gate electrode of P-channel V-FET $Q_7$). The pull-down resistor R is connected between the negative side terminal $V_-$ and the base electrode of the npn transistor $Q_4$ (or gate electrode of n-channel V-FET as shown in FIG. 2 or FIG. 3. The value of the resistance is not critical, it is sufficient so long as it is equivalent to or several times as high as that of the ON-resistance of the C-MIS transistors $Q_1$, $Q_2$, $Q_5$ or $Q_6$, preferably the range being from equal up to ten time the ON-resistance.

The resistor is a simple but effective element for the pull-up and pull-down element. It can be easily fabricated in IC chips, by conventional semiconductor technology such as diffusion or ion implantation for example. It can be also fabricated on the surface of an IC chip by spattering, etc. In any case, it is necessary to add a pattern for R. So, in some cases it is more convenient from the view point of production, to make the pull-up and pull-down elements with the next described circuitries which do not require a special pattern or additional process.

FIG. 4.2 shows the pull-up and pull-down elements each composed of a depletion type MIS-FET, whose gate is connected to its respective source. By such connection, the MIS-FETs work in a constant current mode. The constant current source is better than constant resistance R, because as long as the current flows its internal resistance is almost zero, so the pull-up or pull-down effect is better than with a resistor.

These type of transistors are plentifully included in conventional MIS logic circuits, so it is not necessary to provide an additional process to fabricate them, and they can be fabricated altogether with other transistors, therefore it is convenient from the view point of manufacturing. This merit similarly applies for the circuitry shown in FIG. 4.3.

FIG. 4.3 shows the pull-up and pull-down elements each composed of a depletion type MIS-FET, whose gate is connected to its respective drain electrode. The functions and effects of this type can be easily understood from the analogy of the above explanation. So, the description is omitted for the sake of simplicity.

Figure 5B:
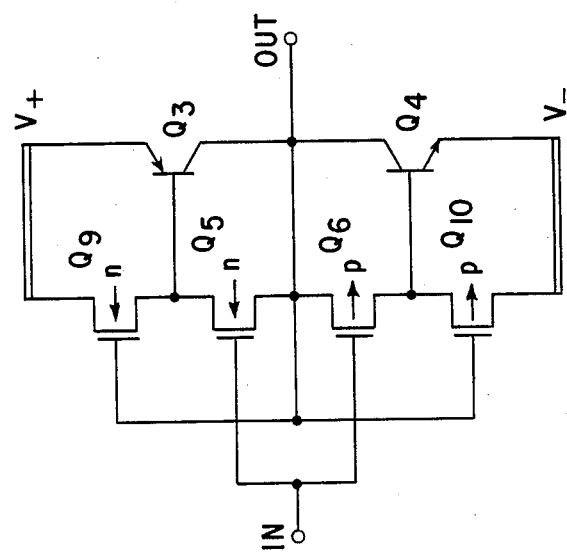
FIG. 5b shows a non-inverting type circuit.
Figure 5A:
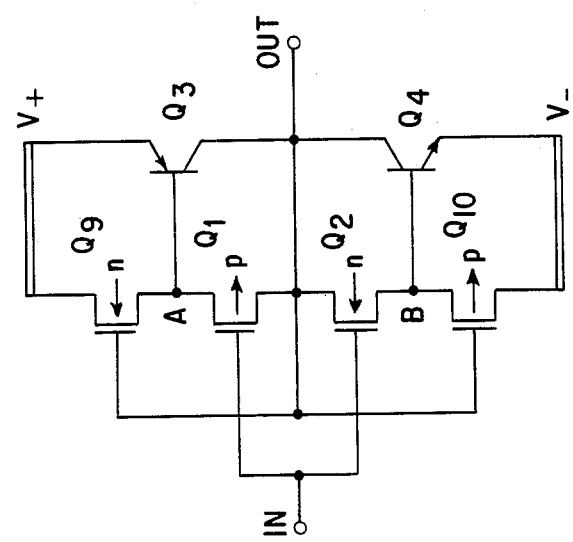
FIG. 5a shows an inverting type circuit.

FIG. 5 shows another variation of the present invention, corresponding to FIG. 2. FIG. 5a shows an inverting type and FIG. 5b shows a non-inverting type circuit. Comparing the figures with FIG. 2a and FIG. 2b (together with FIG. 4.2), the difference is that the gate electrodes of the pull-up and pull-down elements are connected to the output terminal. By doing so, the pull-up and pull-down action is further enhanced. For the pull-up element, transistor $Q_9$ is a n-channel MIS-FET, and for the pull-down element, transistor $Q_{10}$ is a p-channel MIS-FET. The threshold voltage $V_{th}$ of these transistors $Q_9$ or $Q_{10}$ is almost zero or minus.

The operation is as follows. When the input signal IN begins to switch from L to H, the n-channel MIS transistor $Q_2$ becomes ON and bipolar transistor $Q_4$ becomes ON. At this moment the MIS-FET $Q_9$ is still ON. And the p-channel MIS-FET $Q_{10}$ is also receiving the initial H level of the output signal OUT, and is not conductive. So the rush current of this circuit is very small, namely it does not consume the base current of the npn bipolar transistor $Q_4$. Therefore, the switching speed to turn the npn transistor $Q_4$ ON is much faster than other pull-down circuitry. So, the total switching speed of the circuit is further enhanced.

When the level of the output signal OUT decreases to the level of $V_-$ plus $V_{BE}$, the circuit begins to change the operation mode. The p-channel MIS-FET $Q_{10}$ turns ON, the current through the npn transistor $Q_4$ to the serial path of $Q_2$ and $Q_{10}$. Then the stable state of the signal level begins and continues until the input signal varies.

When the input signal IN turns from H to L, the operation is similar to the above described operation. And as the level of the output signal OUT increases, the pull-up transistor $Q_9$ becomes ON and it pulls up the output signal to $V_+$. The pull-up action is similarly enhanced. And when the output signal level increases up to $V_+ - V_{BE}$, the operation mode shifts from $Q_3$ to the serial path of $Q_9$ and $Q_1$. In any state of operation, either the transistors $Q_1$, $Q_3$ and $Q_9$ or the transistors $Q_2$, $Q_4$ and $Q_{10}$ are in the OFF state, therefore, the current running through the circuit from $V_+$ to $V_-$ is very small.

FIG. 5b shows the non-inverting type circuit. Comparing FIG. 5b to FIG. 5a, the difference is that the p-channel MIS-FET $Q_1$ is replaced by a n-channel MIS-FET $Q_5$, and the n-channel MIS-FET $Q_2$ is replaced by a p-channel MIS-FET $Q_6$. The operation and effect are similar to that of FIG. 2b. It will be easy for one skilled in the art to understand the operation of the circuit, so the description of the operation and effect are omitted for the sake of simplicity.

In the above disclose of circuitry for the pull-up and pull-down element, the MIS-FET may be replaced by the corresponding type of V-FET. The function and effect is all the same. Many other variations may occur to one skilled in the art, for example, combining several kinds of circuitries shown in FIG. 4 as the pull-up and pull-down element, but they are all within the scope and spirit of the present invention. But it will be clear to one skilled in the art that, the embodiments of FIGS. 4 and 5 are most essential and effective, moreover it is easiest and practical from the view point of manufacturing.

As has been described above, the complementary circuits of the present invention improve the defects of the prior art C-MIS logic circuit, and provide high power handling capacity, high speed and stable operation with very lower power consumption.

What is claimed is:

1. A complementary logic IC (Ingtegrated circuit) comprising:
    a first voltage supply source;
    a second voltage supply source having a lower potential said first voltage supply source;
    an output stage circuit, having a p-channel vertical FET (V-FET) and an n-channel V-FET, whose drains are connected to each other to form an output for outputting an output signal, said p-channel and n-channel V-FET's each having a source connected to said first and second voltage sources, respectively;
    an input stage circuit formed of a first MIS-FET (Metal Insulator Semiconductor type Field Effect Transistor) having one conductivity type channel and a second MIS-FET having an opposite conductivity type channel with respect to said first MIS-FET, said first and second MIS-FETs connected between the gate and drain of the p-channel and n-channel V-FETs, respectively, and wherein the gates of said first and second MIS-FETs are connected together to form an input for receiving the input signal; and
    pull-up and pull-down elements respectively provided between the gate and voltage supply source of said p-channel and n-channel V-FETs.

2. A complementary logic IC (Integrated Circuit) comprising:
    a first voltage supply source;
    a second voltage supply source having a lower potential than said first voltage supply source;
    an output stage circuit having a pnp type bipolar transistor and an npn type bipolar transistor whose collectors are connected to each other to form an output for outputting an output signal, said pnp type and npn type bipolar transistors each having an emitter connected to said first and second voltage supply sources, respectively;

an input stage circuit having a first MIS-FET (Metal Insulator Semiconductor type Field Effect Transistor) having one conductivity type channel land a second MIS-FET having an opposite conductivity type channel with respect to aid first MIS-FET, said first and second MIS-FETs connected between the base and collector of the pnp type and npn type bipolar transistors, respectively, and wherein the gates of said first and second MIS-FETs are connected together to form an input for receiving the input signal;

a pull-up means, provided between said base of said pnp type bipolar transistor and said first voltage supply source, for raising the voltage of said output signal higher than the voltage of said first voltage supply source minus a base-emitter forward voltage of the pnp type bipolar transistor when said output signal becomes a high level; and a pull-down means, provided between said base of said npn type bipolar transistor and said second voltage supply source, for lowering the voltage of said output signal lower than the voltage of said second voltage supply source plus a base-emitter forward voltage of the npn type bipolar transistor when said output signal becomes a low level which is lower than said high level.

3. The complementary logic IC of claim 2 or 1, wherein said pull-up and pull-down elements are each composed of a resistor.

4. The complementary logic IC of claim 3, wherein each said resistor has a resistance value in the range form equivalent to the ON-resistance value in the range from equivalent to the ON-resistance of said MIS-FET to ten times the ON-resistance of said MIS-FET.

5. The complementary logic IC of claim 2 or 1, wherein:

said pull-up and pull-down elements are each composed of a depletion type FET whose gate is connected to its source electrode.

6. The complementary logic IC of claim 2 or 1, wherein:

said pull-up and pull-down elements are each composed of A FET whose gate is connected to its respective drain, and said FET having a lower threshold voltage than a bipolar transistor.

7. A complementary logic IC (Integrated Circuit) comprising:

a first voltage supply source;

a second voltage supply source having a lower potential than said first voltage supply source;

an output stage circuit having a pnp type bipolar transistor and an npn type bipolar transistor whose collectors are connected to each other to form an output for outputting an output signal, said pnp type and npn type bipolar transistors each having an emitter connected to said first and second voltage supply sources, respectively;

an input stage circuit having a first MIS-FET (Metal Insulator Semiconductor type Field Effect Transistor) having one conductivity type channel and a second MIS-FET having an opposite conductivity type channel with respect to said first MIS-FET, said first and second MIS-FETs connected between the base and collector of the pnp type and npn type bipolar transistors, respectively, and wherein the gates of said first and second MIS-FETs are connected together to form an input for receiving the input signal;

an n-channel MIS-FET connected between the base of said pnp type bipolar transistor and the first voltage supply source and having a gate operatively connected to the collector of said pup type bipolar transistor; and a p-channel MIS-FET connected between the base of said npn type bipolar transistor and the second voltage supply source and having a gate operatively connected to the collector of said npn type bipolar transistor.

* * * * *